United States Patent
Hsieh et al.

(10) Patent No.: US 7,355,866 B2
(45) Date of Patent: Apr. 8, 2008

(54) METHOD OF DETECTING PHASE-LOSS STATE OF THREE-PHASE POWER SUPPLY

(75) Inventors: Ting-Chung Hsieh, Taoyuan (TW); Shih-Chieh Liao, Taoyuan (TW)

(73) Assignee: Delta Electronics Inc., Taoyuan (TW)

( * ) Notice: Subject to any disclaimer, the term of this patent is extended or adjusted under 35 U.S.C. 154(b) by 337 days.

(21) Appl. No.: 11/196,245

(22) Filed: Aug. 4, 2005

(65) Prior Publication Data
US 2006/0187683 A1  Aug. 24, 2006

(30) Foreign Application Priority Data
Feb. 23, 2005  (TW) ............................... 94105421 A

(51) Int. Cl.
 H02H 7/10 (2006.01)
 H02H 3/18 (2006.01)
(52) U.S. Cl. .......................................... 363/50; 361/85
(58) Field of Classification Search .................... 363/9, 363/10, 50, 52, 53, 55, 56.01, 56.12, 148, 363/152; 361/23, 33, 85, 86, 90, 91.1, 111
See application file for complete search history.

(56) References Cited

U.S. PATENT DOCUMENTS

| 4,159,514 A | * | 6/1979 | Kakalec | 363/53 |
| 4,823,226 A | * | 4/1989 | Reed et al. | 361/85 |
| 5,570,258 A | * | 10/1996 | Manning | 361/85 |
| 5,665,256 A | * | 9/1997 | Toth | 219/130.21 |

\* cited by examiner

Primary Examiner—Matthew V. Nguyen

(57) ABSTRACT

The disclosure relates to a method of detecting the phase-loss state of the three-phase power supply. When the phase-loss condition occurs in the input three-phase power supply of the power converter, it is determined whether the three-phase power source is in the phase-loss state through the characteristic of the frequency and amplitude variations of the ripple voltage of the DC bus, and through the sampling and the continuous detecting of the ripple voltage variations by making use of the sensor of the power converter in cooperation with the software calculation, it is determined whether the three-phase power source is in a phase-loss state. When the detected ripple voltage of the DC bus fulfills the phase-loss conditions, it is determined that the three-phase power source is in a phase-loss state.

8 Claims, 4 Drawing Sheets

US 7,355,866 B2

METHOD OF DETECTING PHASE-LOSS STATE OF THREE-PHASE POWER SUPPLY

This Non-provisional application claims priority under 35 U.S.C. § 119(a) on Patent Application No(s). 094105421 filed in Taiwan on Feb. 23, 2005, the entire contents of which are hereby incorporated by reference.

BACKGROUND OF THE INVENTION

1. Field of Invention

The invention relates to a method of detecting the state of the power supply, and in particular to a method of detecting and determining the phase-loss state of the three-phase power supply by means of a specific software.

2. Related Art

With the increasing popularity of power electronics, the application and utilization of power converters such as the Uninterruptible Power Supply system and the AC motor drive is widespread and is getting more and more prominent and important. For a comprehensive description of the prior in this respect, please refer to FIG. 1. FIG. 1 is a system block diagram of the ordinary DC-AC Inverter of the prior art. As shown in FIG. 1, the three-phase alternating current (AC) voltage supplied by a power source is converted to the direct current (DC) voltage through a rectifier 10, and then a filter circuit 20 is utilized to filter the rectified pulsating DC voltage into a more stable DC voltage (on the DC bus), which is then supplied to a DC-AC Inverter 30, used to generate the power supply required for the operation of a motor 50. In addition, a control circuit 40 is provided and specifically utilized to control the overall operation of the rectifier 10, the filter circuit 20, and the DC-AC Inverter 30.

When the phase-loss condition of the three-phase power source occurs, it will result in the increase of the input current of the rectifier 10, and the augmentation of the amplitude of the ripple voltage on the DC bus, thus adversely affecting the service lives of the rectifier 10 and the capacitors in the filter circuit 20. Presently, the power source phase-loss state detection and determination is done by hardware circuits. As such, it is liable to cause the additional cost of the hardware and the occupation of the additional space in the power electronics; besides, since the service life of an electronic component is of limited duration, its malfunction probability is pretty high.

Therefore, the research and development of a low cost power source phase-loss detection and determination method is an urgent and important task in this field.

SUMMARY OF THE INVENTION

In view of the above-mentioned problems and shortcomings of the prior art, the object of the invention is to provide a method for detecting the phase-loss state of the three phase power supply, and the phase-loss state of the power source is determined through detecting the variations of the ripple voltage on the DC bus by means of software calculations instead of the hardware detection circuit as utilized in the prior art, thus achieving the objective of reducing the cost.

Therefore, to achieve the above-mentioned objective, the method of detecting the phase-loss state of the three-phase power source disclosed by the invention includes the following steps. Firstly, setting the phase-loss state detection critical values, including the loss phase frequency, the voltage detection upper limit, the voltage detection lower limit, and the loss phase ripple voltage. Next, detecting the voltage variations of the DC bus, to obtain the magnitude of the ripple voltage amplitude and frequency on the DC bus in a sample period. Then, determining that the three-phase power source is in phase-loss state, when said frequency and voltage fulfill one of the phase-loss conditions.

In the above description, the phase-loss conditions include: the frequency of the power source is equal or less than the phase-loss state frequency (for example, 90 Hz~130 Hz), and its voltage is equal to or higher than the phase-loss state ripple voltage.

Through the application of the method of detecting the phase-loss state of the three-phase power source of the invention, the phase-loss state of the power source is determined through sampling and continuously detecting the variations of the ripple voltage on the DC bus by means of the software calculations instead of the hardware circuit, thus achieving the purpose of reducing the cost of the power source phase-loss detection.

Further scope of the applicability of the present invention will become apparent from the detailed description given hereinafter. However, it should be understood that the detailed description and specific examples, while indicating preferred embodiments of the present invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below illustration only, and thus are not limitative of the present invention, and wherein.

DETAILED DESCRIPTION OF THE INVENTION

The purpose, construction, features, and functions of the present invention can be appreciated and understood more thoroughly through the following detailed description with reference to the attached drawings.

In general, the frequency of the ripple voltage of the DC bus is about 6 times the frequency of the voltage of the power source, namely, when the frequency of the voltage of the three-phase power source is 60 Hz, then the frequency of the ripple voltage of the DC bus is 360 Hz; and when the frequency of the voltage of the three-phase power source is 50 Hz, then the frequency of the ripple voltage of the DC bus is 300 Hz.

When the phase-loss state of the three-phase power source occurs, namely, it is reduced from a three-phase power source to a single phase power source, then the frequency of the ripple voltage of the DC bus is about twice the frequency of the power source voltage. For instance, when the frequency of the voltage of the single-phase power source is 60 Hz, then the frequency of the ripple voltage of the DC bus is 120 Hz; and when the frequency of the voltage of the single phase power source is 50 Hz, then the frequency of the ripple voltage of the DC bus is 100 Hz. As such, the characteristic of ripple voltage frequency variation caused by the phase-loss state of the power source may be utilized as one of the conditions in determining the power source phase-loss.

Figure 1:
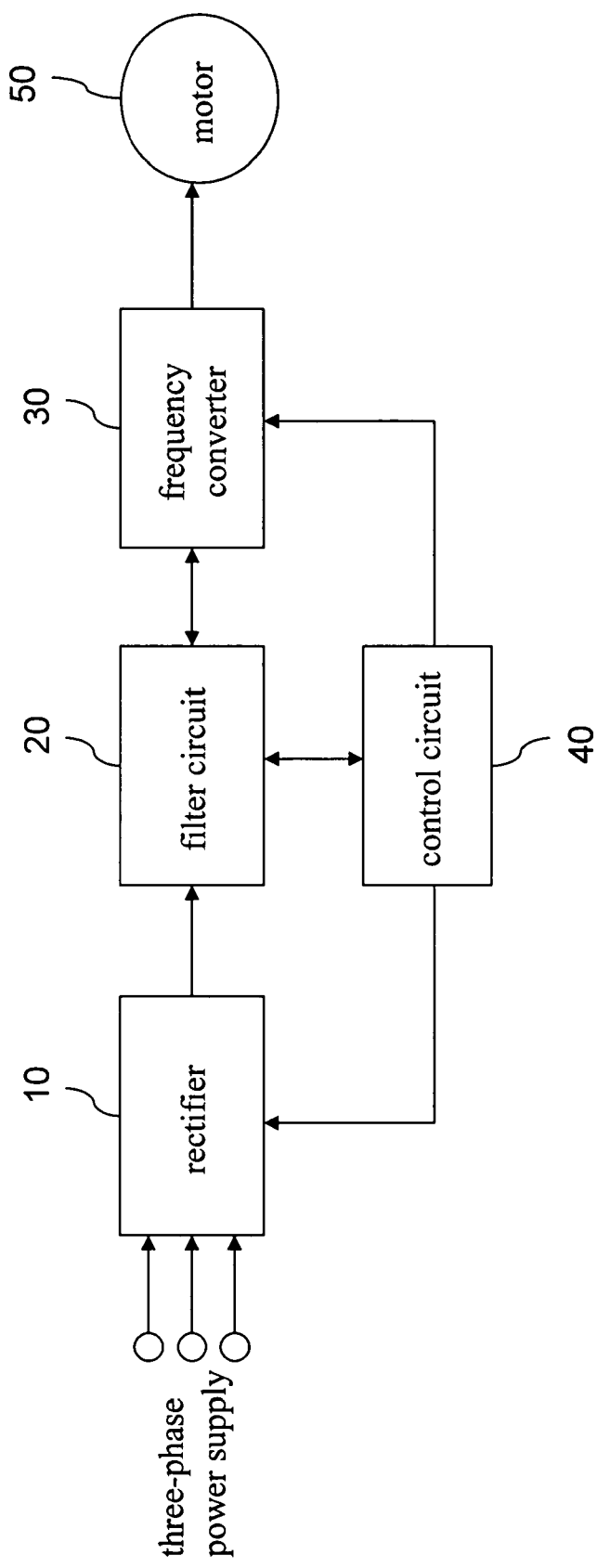
FIG. 1 is a system block diagram of the ordinary DC-AC Inverter of the prior art.
Figure 2:
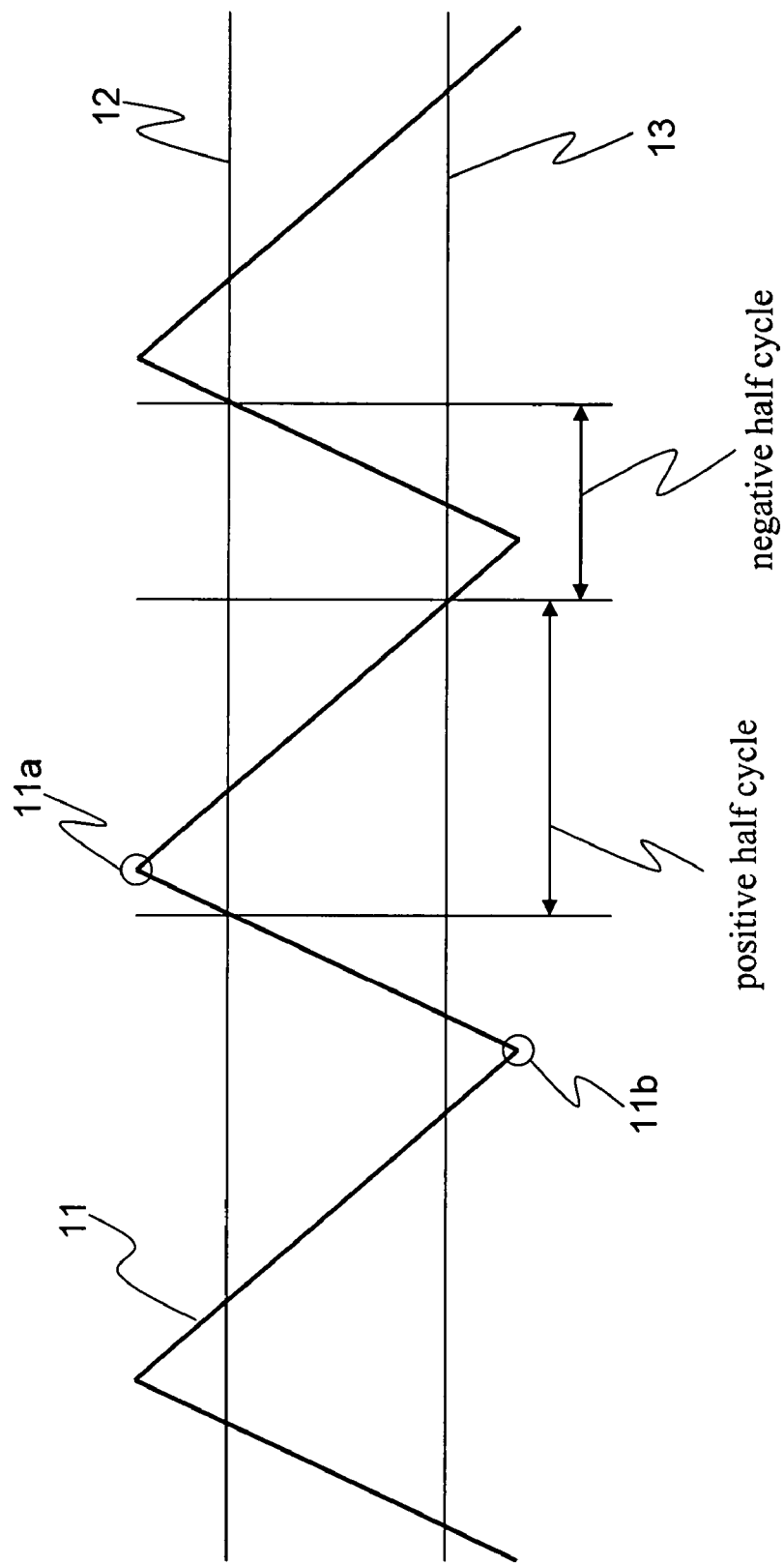
FIG. 2 is a schematic diagram of the waveform of the DC bus ripple voltage according to the embodiment of the invention.

Firstly, refer to FIG. 2 for the schematic diagram of the waveform of the DC bus ripple voltage according to the embodiment of the invention. As shown in FIG. 2, the voltage 11 of the DC bus is continuously detected in the sample time of one cycle period, thus obtaining the maximum value 11a and the minimum value 11b of the ripple voltage and thus the magnitude of the ripple voltage. In addition, the voltage detection upper limit 12 and the voltage detection lower limit 13 are set respectively to determine the period of the ripple voltage, which is used in turn to determine and obtain the frequency of the ripple voltage.

Figure 3:
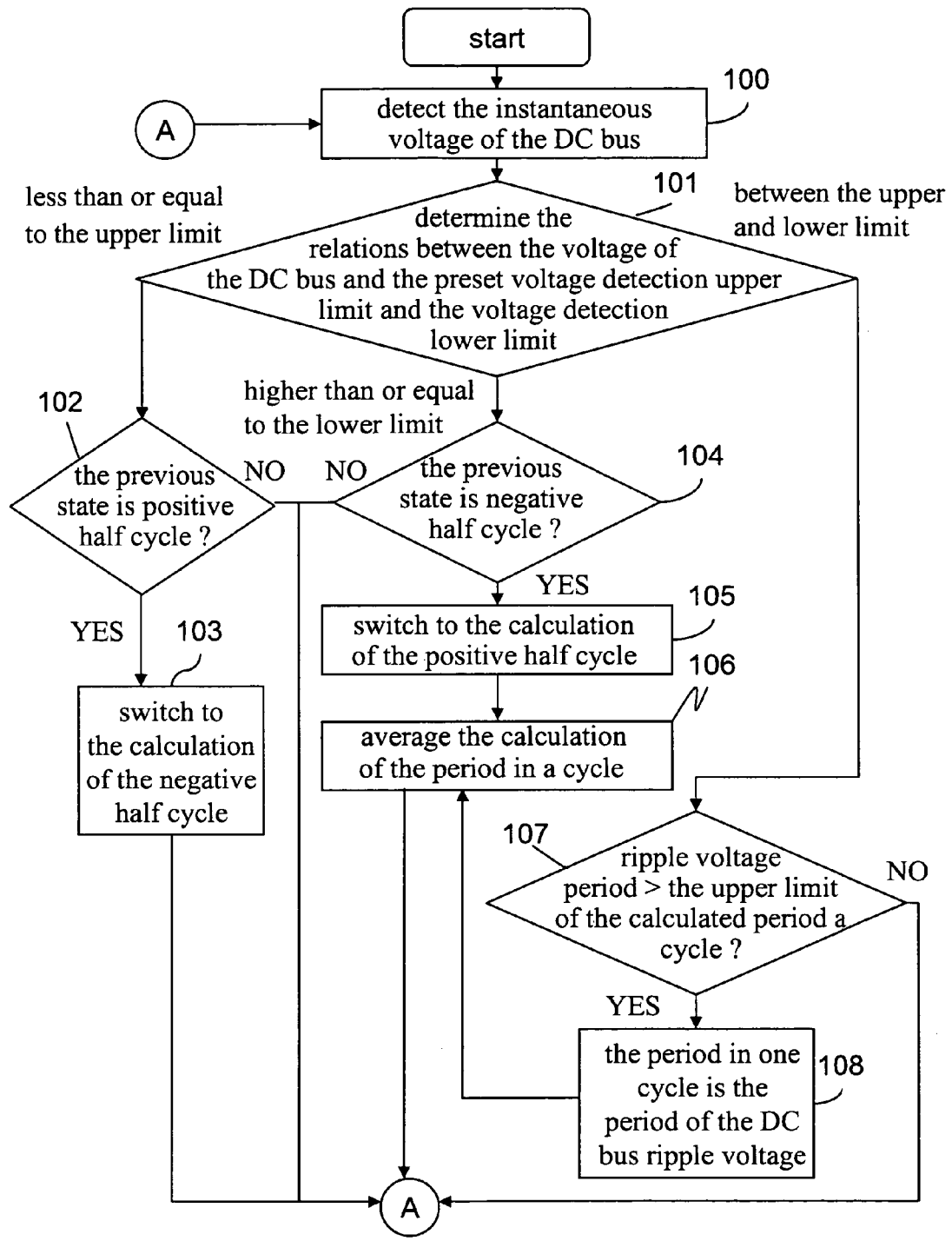
FIG. 3 is a system flowchart of the method utilized in calculating the period of the ripple voltage of the DC bus according to the embodiment of the invention.

Subsequently, refer to FIG. 3 for the system flowchart of the method utilized in calculating the period of the ripple voltage of the DC bus according to the embodiment of the invention. Firstly, detect the instantaneous voltage value of the DC bus (step 100). Next, determine the relation between the voltage detection upper and lower limits (step 101), where there are three kinds of relations of: less than or equal to the voltage detection lower limit, higher than or equal to the voltage detection upper limit, or between the voltage detection lower limit and the voltage detection upper limit.

If the voltage of the DC bus is less than or equal to the set voltage detection lower limit, then it is determined whether the previous state is of the positive half cycle ripple voltage (step 102). If it is determined that the previous state is of the positive half cycle ripple voltage, then the process is switched to the step of calculate the duration of the negative half cycle (step 103), and then the process flow returns to step 100.

However, if the voltage of the DC bus is higher than or equal to the voltage detection upper limit, then it is determined whether the previous state is of the negative half cycle ripple voltage (step 104). If it is determined that the previous state is of the negative half cycle ripple voltage, then the process is switched to the step of calculating the duration of the positive half cycle (step 105), thus obtain the period of the ripple voltage; yet if the previous state is not of the negative half cycle ripple voltage, then the process flow returns to step 100.

If the ripple voltage is between the set voltage detection upper limit and the set voltage detection lower limit, then it is further determined whether the period of the ripple is longer than or equal to the upper limit of the period in one cycle (step 107); if the period of the ripple voltage is longer than or equal to the upper limit of the period in one cycle, then said period in one cycle is the period of ripple voltage of the DC bus.

Following the steps 105 and 108, the average value of the period in one cycle is calculated (step 106) to reduce the detection error. Then, the process flow returns to step 100 to continue the detection and calculation of the period of the ripple voltage.

As mentioned above, the period of the ripple voltage of the DC bus is thus obtained. In addition, since the frequency is the reciprocal value of the period, namely frequency=1/period, as such the frequency of the ripple voltage can also be obtained.

Figure 4:
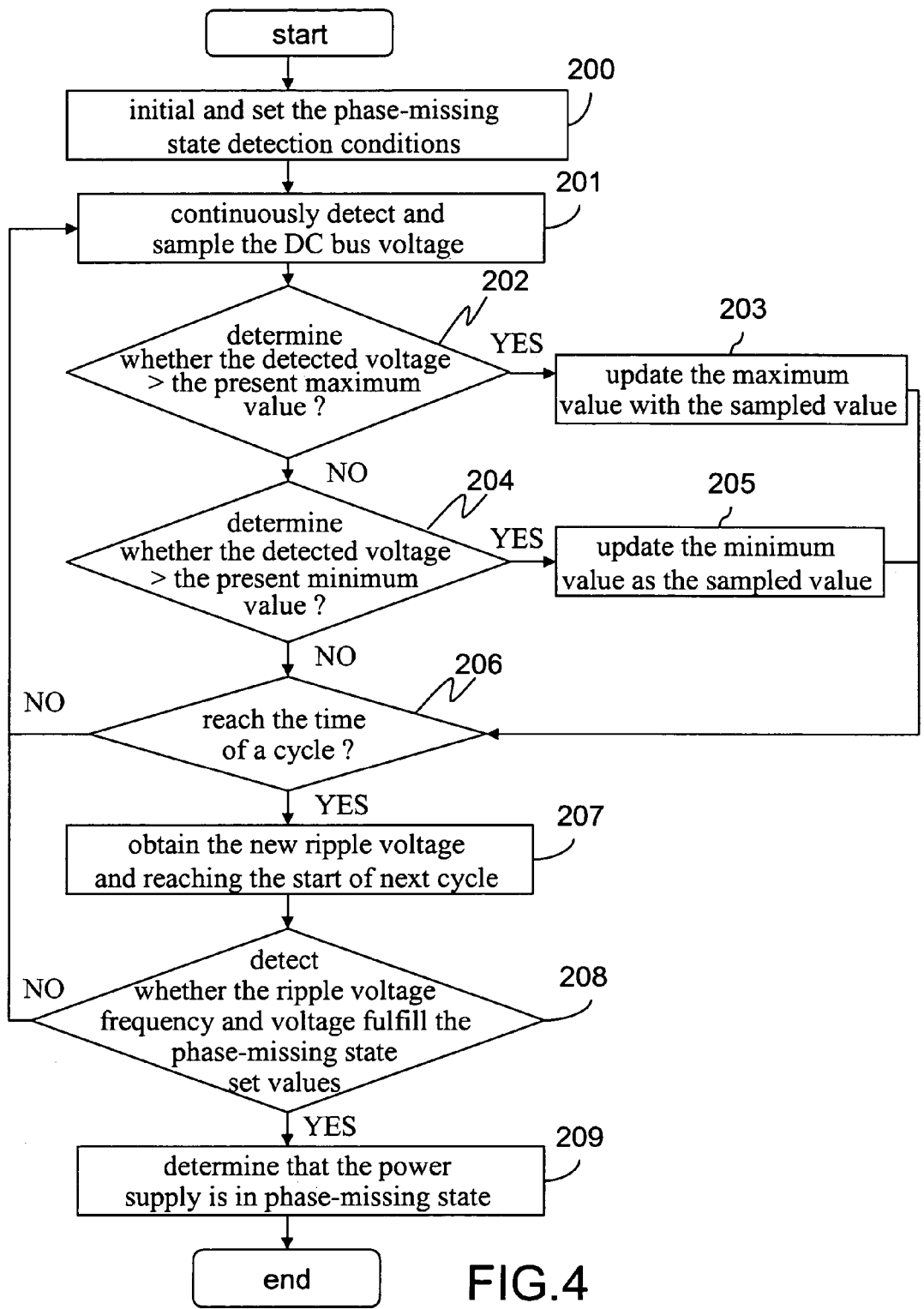
FIG. 4 is a flowchart of the method of detecting the phase-loss state of the 3-phase power source according to the embodiment of the invention.

Then, refer to FIG. 4 for the flowchart of the method of detecting the phase-loss of the 3-phase power source according to the embodiment of the invention.

As shown in FIG. 4, firstly, initial and set the various set values in the detection of the phase-loss state of the power source (step 200), wherein the various set values may include: the voltage detection upper limit, the voltage detection lower limit, the frequency of the phase-loss state and the ripple voltage of the phase-loss state, and setting the instantaneous maximum and minimum voltages of the DC bus. Their phase-loss state frequencies are two times the frequency of the power source voltage (for example, 90 Hz~130 Hz).

Subsequently, continue the detection and sample of the ripple voltage of the DC bus (step 201), and compare and determine if the sampled voltage value is higher than or equal to the current maximum voltage value (step 202); if the sampled value is higher than or equal to the current maximum voltage value, then updating the maximum value with the sampled value (step 203); otherwise if the sampled value is less than the current maximum voltage value, then the maximum voltage value remains unchanged.

Then, compare and determine whether the sampled voltage value is less than or equal to the current minimum voltage value (step 204); if the sampled voltage value is less than or equal to the current minimum voltage value, then update the current minimum voltage value with the sampled value (step 205); if the sampled voltage value is higher than the minimum voltage value, then the minimum voltage value remains unchanged.

Furthermore, follow the steps 203,204, and 205, it is determined whether the sampled time of the ripple voltage of the DC bus has reached one cycle (step 206), namely, if it has reached the time of one cycle; if it has not reached the one cycle sampled time, then the process returns to step 201 to continue sampling the instantaneous voltage of the DC bus.

When reach one cycle sample time, that means the beginning of the next cycle, then subtract the minimum ripple voltage of the DC bus from the maximum ripple voltage of the DC bus to obtain the sampled ripple voltage of the DC bus of the previous cycle, and setting the instantaneous voltage of the DC bus as the initial maximum voltage and the initial minimum voltage to be used as references for the processing of the next cycle (step 207).

Finally, determine whether the detected ripple voltage is higher than or equal to the set ripple voltage of the loss phase, and also determine whether the frequency of the detected ripple voltage is less than or equal to the set ripple voltage frequency of the loss phase (for example, two times of the power source frequency 90~130 Hz) (step 208), if all the above-mentioned phase-loss conditions are satisfied, then it is determined that the present power source is in the phase-loss state (step 209), and thus the result is provided to the phase-loss protection circuit (not shown) to protect the device as required; otherwise, the process flow returns to step 201.

Furthermore, the average value calculation is utilized for the calculation of the ripple voltage and its period to reduce possible error, and the sensitivity of detecting the power source phase-loss state may be adjusted through varying the set ripple voltage of the phase-loss state, thus achieving the purpose of flexible application and equipment protection.

Through the application of the method of detecting the phase-loss state of the three-phase power source of the invention, the phase-loss state of the power source can be determined by the calculations based on the variations of the ripple voltage frequency and amplitude obtained through sampling and continuous detection, in this manner the hardware circuit detection method is replaced, thus achieving the cost reduction of the detection of the power source phase-loss.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of detecting phase-loss state of a three-phase power source, comprising the following steps:
    setting conditions for detection and determination of the phase-loss state;
    detecting ripple voltage variations of DC (direct current) bus in a sampling cycle thus to obtain a ripple voltage and a frequency of the ripple voltage of the DC bus;
    comparing said ripple voltage and said frequency with said set conditions for detection and determination of the phase-loss state; and
    when said voltage and said frequency fulfill the conditions for detection and determination of the phase-loss state, determining that said three-phase power source is in phase-loss state,
    wherein the phase-loss detection conditions comprising:
    a voltage detection upper limit, a voltage detection lower limit, a phase-loss state frequency, and a phase-loss state ripple voltage.

2. The method of detecting phase-loss state of a three-phase power source as claimed in claim 1, wherein in said sample cycle, when said sampled voltage is higher than or equal to a maximum voltage, updating said maximum voltage with said sampled voltage.

3. The method of detecting phase-loss state of a three-phase power source as claimed in claim 2, wherein in said sample cycle, when said sampled voltage is less than or equal to a minimum voltage, updating said minimum voltage with said sampled voltage.

4. The method of detecting phase-loss state of a three-phase power source-as claimed in claim 3, wherein said ripple voltage is the difference between said maximum voltage and said minimum voltage.

5. The method of detecting phase-loss state of a three-phase power source-as claimed in claim 1, wherein the step of obtaining said frequency including:
    when said ripple voltage is less than or equal to said voltage detection lower limit, determining whether the previous sate of said DC bus ripple voltage is of a positive half cycle;
    when said previous sate of said DC bus ripple voltage is of the positive half cycle, then switching to the calculation of a negative half cycle;
    when said ripple voltage is higher than or equal to said voltage detection upper limit, determining whether the previous sate of said DC bus ripple voltage is of a negative half cycle;
    when said previous sate of said DC bus ripple voltage is of the negative half cycle, then completing the calculation of the cycle, thus obtaining the period of said ripple voltage; and
    obtaining said ripple voltage frequency based on the calculated period.

6. The method of detecting phase-loss state of a three-phase power source-as claimed in claim 5, wherein said ripple voltage period is obtained through the step of averaging the result of the calculations in a cycle.

7. The method of detecting phase-loss state of a three-phase power source as claimed in claim 1, wherein the phase-loss state condition is that: said ripple voltage frequency is less than or equal to said phase-loss state frequency and said ripple voltage is higher than or equal to said phase-loss state voltage.

8. The method of detecting phase-loss state of a three-phase power source as claimed in claim 7, wherein said phase-loss state frequency is 90 Hz~30 Hz.

* * * * *